United States Patent [19]
Rogers

[11] Patent Number: 4,498,191
[45] Date of Patent: Feb. 5, 1985

[54] DIGITAL AUTOMATIC FREQUENCY CONTROL WITH TRACKING

[75] Inventor: Terrence E. Rogers, Portsmouth, Va.

[73] Assignee: General Electric Company, Portsmouth, Va.

[21] Appl. No.: 501,685

[22] Filed: Jun. 6, 1983

[51] Int. Cl.³ .......................... H03J 7/02; H04B 1/26
[52] U.S. Cl. .................... 455/164; 455/165; 455/182; 455/183; 455/192
[58] Field of Search ............ 455/164, 165, 182, 183, 455/192, 185, 186; 358/195.1

[56] References Cited

U.S. PATENT DOCUMENTS

| | | | |
|---|---|---|---|
| 4,280,140 | 7/1981 | Skerlos | 358/195.1 |
| 4,302,778 | 11/1981 | Tanaka | 358/195.1 |
| 4,397,038 | 8/1983 | Rzeszewski | 455/165 |
| 4,408,349 | 10/1983 | Yukawa | 455/182 |

OTHER PUBLICATIONS

"A Microcomputer Controlled Frequency Synthesizer for TV", by Rzeszewski et al., 1/78.

*Primary Examiner*—Jin F. Ng

[57] ABSTRACT

A microprocessor controlled phase locked loop tuning system is disclosed which uses a single AFC detector whose threshold is controlled by the microprocessor. The system comprises a microprocessor (10) which provides frequency data to the PLL (11), and this data controls a programmable frequency divider in the PLL which determines the nominal frequency of a VCO (131) in the tuner (13). An AFC detector (141) in the intermediate frequency section (14) provides an AFC voltage output to the single comparator (15). The comparator produces a logic "0" or a logic "1" output to the microprocessor depending on whether the output from the AFC detector is above or below a predetermined threshold. The microprocessor is first operated in a frequency search mode to increase or decrease the frequency of the VCO in predetermined frequency increments depending on the logic state of the output of the comparator (15). During this mode of operation, the microprocessor may be programmed to respond to a change of state of the output of the detector by causing the frequency of the VCO change in the opposite direction to produce a successive predetermined number of detector output state changes and also to cause the VCO frequency changes to be made in smaller increments. After a predetermined number of detector output state changes have been detected, the microprocessor is then operated in a track mode during which time the microprocessor periodically and temporarily changes the predetermined threshold of the detector (15) alternately up and down by supplying pulses to the input of the detector. In this way a "window" is generated to track the tuning frequency.

5 Claims, 7 Drawing Figures

4,498,191

DIGITAL AUTOMATIC FREQUENCY CONTROL WITH TRACKING

FIELD OF THE INVENTION

The present invention generally relates to electronic tuning systems which provide automatic frequency control (AFC), and more particularly to a microprocessor controlled phase locked loop (PLL) tuning system using a single AFC detector whose threshold is controlled by the microprocessor.

BACKGROUND OF THE INVENTIONS

Microprocessor controlled tuning systems are being widely used in television receivers. One approach to such tuning systems is to use a microprocessor to control a PLL that corrects for drift in the local oscillator phase thereby insuring that the local oscillator is always precisely in phase with a fixed frequency crystal oscillator. Previously, such electronic tuning systems have had the shortcoming that they were programmed for proper tuning only under the condition that the received signal was at one of the nominal carrier frequencies specified by the FCC for television channels. There are occasions, such as arise in connection with CATV and MATV systems and with video games, when the signal is not at one of the nominal picture carrier frequencies, and as a result such a system does not produce proper tuning.

It is possible to design the microprocessor controlled PLL tuning system to permit the programming of offsets in the local oscillator frequency from the nominal value. In one such system, an entry from a keyboard causes the microporcessor to produce an output to a programmable frequency divider in the PLL which determines the nominal oscillator frequency. The tuner intermediate frequency is sampled to provide information to the microprocessor as to whether the tuner local oscillator needs to be adjusted to accommodate a frequency offset in the received signal. The microprocessor uses this information to generate an output to the programmable frequency divider which determines the amount of frequency offset of the local oscillator frequency away from the nominal value. There are occasions which have been encountered in practice with certain CATV systems, and some MATV systems, in which television signals on adjacent channels are converted to frequencies differing from the nominal value by the same amount. One example is the case of the so-called "constant interval" CATV system in which the carrier frequencies of both channels 5 and 6 are increased by 2 MHz as compared with the nominal values. This places the resultant sound carrier of channel 5 at 0.5 MHz above the nominal frequency of the channel 6 picture carrier. When channel 6 is selected, the tuning system as described up to this point never acquires the displaced channel 6 picture carrier 2 MHz above the nominal value. Instead, it locks to the displaced channel 5 sound carrier. In order to avoid this, if is necessary to provide the tuning system with a mechanism for beginning the search procedure again, but with a greater initial frequency offset.

A specific example of an electronic, microprocessor controlled television tuning system capable of acquiring channels offset from the nominal frequency is disclosed in U.S. Pat. No. 4,280,140 issued to Peter C. Skerlos. In this system, AFC discriminator information is provided to the microprocessor for the generation of digital outputs for controlling stepwise tuning adjustments. This information is generated by a pair of window comparators, edge/direction comparator, and a vertical sync detector. When a channel is selected, the tuning system first synthesizes the correct frequency for that channel. Then the microprocessor first looks at the output of the edge/direction comparator to determine the direction of tuning. Once the proper tuning direction is determined by the edge/direction comparator, the microprocessor then steps the AFC tuning voltage in predetermined increments until the limit of the number of allowed steps for that particular channel is reached. When this limit is reached and no carrier is found, tuning is switched and the voltage stepping procedure is initiated again. For a detected carrier to be valid, the output of the window comparators should be high and the vertical sync detector should produce a train of 60 Hz pulses, indicating the presence of vertical sync information. Although one would expect the Skerlos system to work well, in the highly competitive television market the cost of implementing such a system is objectionable.

SUMMARY OF THE INVENTION

It is therefore an object of the present invention to provide a microprocessor controlled PLL tuning system that is capable of accommodating a frequency offset but is less expensive to manufacture than prior tuning systems of similar type.

Briefly stated, the object of the invention is accomplished by using a single detector whose threshold is controlled by the microprocessor for detecting the arrival at the proper frequency. More specifically, the microprocessor sends frequency data to the PLL. The PLL also receives a sample of thevoltage controlled oscillator (VCO) located in the tuner and compares it with a crystal standard by dividing the VCO sample according to the frequency data and applying it to a phase detector whose other input is connected to a divided down crystal oscillator signal. The phase detector produces output pulses that vary in width and polarity as a function of whether the VCO signal is above or below the proper frequency and phase required by the frequency data. A loop filter converts the pulses into a varying d.c. voltage which in turn is used to control the VCO. A portion of the i.f. amplifier is arranged so that it can detect errors in the desired i.f. This automatic frequency control (AFC) detector is connected to an AFC comparator whose output is connected to the microprocessor. The output of the AFC comparator is a logic "1" if the carrier frequency is higher than the input data value, and logic "0" if the carrier frequency is lower than the input data value. The microprocessor has an offset control so that the exact value of voltage at which the AFC comparator switches from a logic "1" to a logic "0" can be controlled by the microprocessor.

BRIEF DESCRIPTION OF THE DRAWINGS

The foregoing and other objects, aspects and advantages of the invention will be better understood from the following detailed description of a preferred embodiment of the invention with reference to the accompanying drawings, in which.

DESCRIPTION OF THE PREFERRED EMBODIMENT

Figure 1:
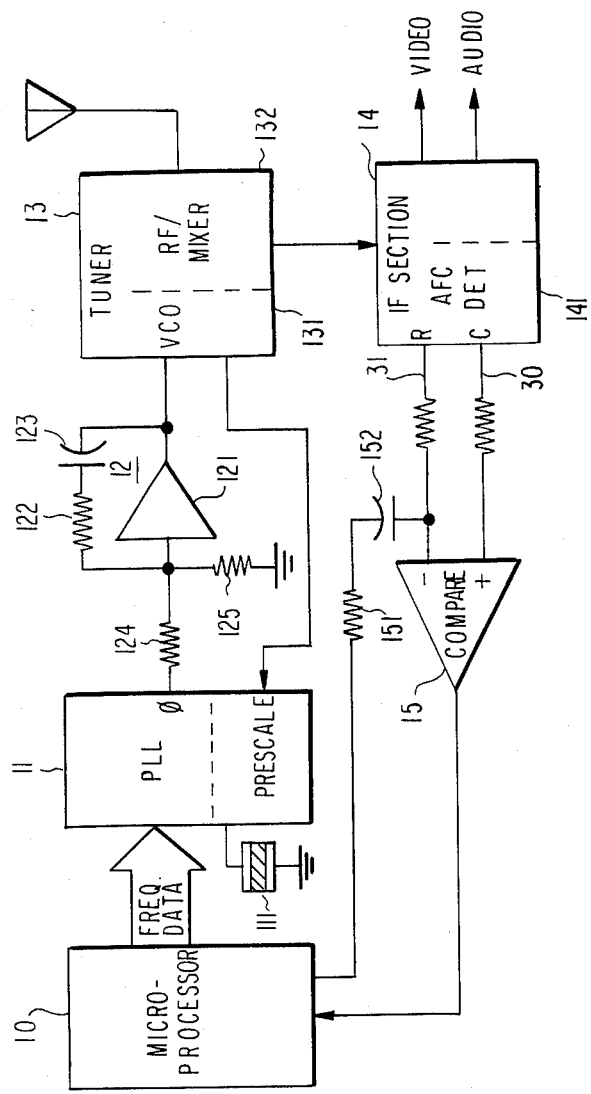
FIG. 1 is a block and schematic diagram showing the basic parts and arrangement of the preferred embodiment of the invention.

Referring now to the drawings, and more particularly to FIG. 1, a microprocessor 10 responds to user input data indicating the selection of a particular receiving frequency and sends frequency data to the phase locked loop (PLL) circuit 11. The PLL circuit receives a sample of the voltage controlled oscillator (VCO) 131 located in the tuner 13 and compares it with a crystal standard 111 by dividing the VCO sample according to the frequency data and applying it to a phase detector $\phi$ whose other input is connected to a divided down crystal signal. The comparator output pulses vary in width and polarity as the VCO signal is above or below the proper frequency and phase required by the frequency data. The loop filter 12 converts the pulses into a varying d.c. voltage which in turn is used to control the VCO. This feedback is arranged in such a way that the frequency tends to remain at the value required by the frequency data supplied by the microprocessor. The VCO 131 is also used in a hetrodyne frequency mixer in the r.f. portion 132 of the tuner 13 where it converts the incoming r.f. of the selected receiving frequency from the antenna to the common i.f. of the i.f. amplifier 14. For example, if the tuner is used in a television receiver, an intermediate frequency of 45.75 MHz might be generated for either of the selected channels 2 or 6 as follows:

| Ch. No. | Channel Carrier | VCO | I.F. |
|---|---|---|---|
| 2 | 55.25 MHz | 101 MHz | 45.75 MHz |
| 6 | 83.25 MHz | 129 MHz | 45.75 MHz |

A portion of the i.f. amplifier is arranged so that it can detect errors in the 45.75 MHz i.f. carrier frequency. This AFC detector 141 is connected to the AFC comparator 15 whose output is connected to the microprocessor 10. The AFC output line 30 increases in voltage relative to a reference output line 31 if the carrier frequency is higher than the frequency data value (and consequently lower than 45.75 MHz in the i.f. because the difference between the VCO and carrier frequency decreases) and the output of comparator 15 is a logic "1". If the carrier frequency is lower than the data value, the output voltage on line 30 is lower than the output voltage on line 31 and the comparator 15 outputs a logic "0". The microprocessor provides an offset control signal which is coupled to the reference input terminal of comparator 15 so that the exact value at which the comparator switches from logic "1" to logic "0" can be controlled by the microprocessor to be either of two preset values.

Although shown as separate blocks in FIG. 1, the microprocessor 10 and the PLL 11 are, in the preferred embodiment, manufactured as a single integrated circuit using CMOS technology by General Instrument Co. This circuit basically incorporates the PIC1656 13-bit microcomputer and in part the AY-3-2012 Economega IV PLL Synthesizer Divider which are manufactured and commercially available from the General Instrument Co. The combined circuit is referred to as the Economega VII-IIA. Since the details of these circuits do not form a part of the subject invention, the reader is referred to the circuit specifications published by the manufacturer for specific circuit details.

The microprocessor 10 and the PLL 11 are the heart of the control unit. The microprocessor receives commands from the user, translates them into specific actions and resolves conflicts. In a specific embodiment, five hundred twelve, 13-bit words contain the program which manipulates data and input/output (I/O) through the arithmetic logic unit (ALU), accumulator and random access memory (RAM). The PLL 11 is designed to work with a 380/400 synchronous variable emitter coupled logic (ECL) prescaler like the Plessey CT2010. This type of prescaler latches 380 count on an edge only; otherwise, it divides by 400. The basic PLL is a conventional divide by M reference, divide by N into edge phase/frequency comparator. The phase comparator $\phi$ drives a tri-state output charge pump which will saturate if the frequency is much lower or higher (i.e. the phase error exceeds pi radians). The number N is one less than the VCO frequency in MHz. The offset circuitry is somewhat independent. It can output either none, one or anything up to 19 of 20 pulses per comparator cycle at a 100 KHz rate, depending on the 5-bit offset. With a 4 MHz crystal and divide by 380/400 variable synchronous prescaler, the steps are 50 KHz. The frequency always goes higher with prescale control output. The AFC routine manipulates MHz and offset bits to step +1.95 to −1.45 MHz.

The PLL filter 12 comprises an operational amplifier 121 having a resistor 122 and a capacitor 123 connected in series in a negative feedback loop and an input resistor 124. This combination forms an integrator or low pass filter for integrating the output pulses from the phase detector. The values of the resistors 122 and 124 and the capacitor 123 determine the frequency response of the filter. Resistor 125 establishes a precise but low leakage level so that the PLL will not lock at precisely zero error but about 5 to 10 milliradians one way to get out of the dead zone (and possible oscillation) in the detector.

The AFC detector 15 is preferably implemented as a differential pair driving a level translator. The AFC reference on line 31 is set by a voltage divider (not shown) at zero Δf. During a frequency search, the output of the comparator is used to determine the direction of search until the output logic state changes. Thereafter, the microprocessor 10 supplies pulses to the differentiator circuit comprising resistor 151 and capacitor 152 to produce voltage spikes at the base of one of the transistors in the differential pair. This in turn changes the threshold for a few hundred microseconds during which time the microprocessor 10 reads the output of the comparator 15. In this way, the threshold is shifted temporarily higher and lower to make a "window" for the AFC tracking mode. Any step outside the window causes a further search at the nominal AFC threshold.

The operation of the circuit shown in FIG. 1 will be better understood by way of example. Assume that the user has selected channel 2 or 101 MHz. Initially, the output of the comparator 15 is logic "0" meaning that the VCO frequency should be decreased. The frequency is decreased by 250 KHz and the output of the comparator is read again. Suppose that the carrier frequency is actually 54 MHz, as it is in harmonically related cable TV systems. The comparator output would still be a logic "0". The microprocessor could be programmed for the following sequence:

| Step | VCO | I.F. | Comparator 15 |
| --- | --- | --- | --- |
| 1 | 101.00 | 47.00 | 0 |
| 2 | 100.75 | 46.75 | 0 |
| 3 | 100.50 | 46.50 | 0 |
| 4 | 100.25 | 46.25 | 0 |
| 5 | 100.00 | 46.00 | 0 |
| 6 | 99.75 | 45.75 | 0 |
| 7 | 99.50 | 45.50 | 1 |

Note that at step 6, the logic output of comparator 15 is "0". The comparator can be arranged so that center frequency is zero, but an arbitrary amount less is a logic "1". The interpretation of step 6 to step 7 is that the correct frequency is between these two steps. The step size is now decreased from 250 KHz to 31.25 KHz (or some other convenient number for the PLL architecture) and the microprocessor 10 reverses the step direction to positive frequency increments until the comparator 15 output switches to a logic "0". The sequence would be 99.50, 99.53125, 99.5625, 99.59375, 99.625, 99.65625, 99.6875, 99.71875, 99.75 where the i.f. would be 45.75, as required, and the comparator 15 output is a logic "0". If the frequency happened to be some other, there would be a maximum frequency error of only 31.25 KHz if the microprocessor routine stops when the comparator output switches to a logic "0". Further, it is possible to program the microprocessor to make, for example, four cross overs to assure correct lock in the presence of noise.

Figure 2A:
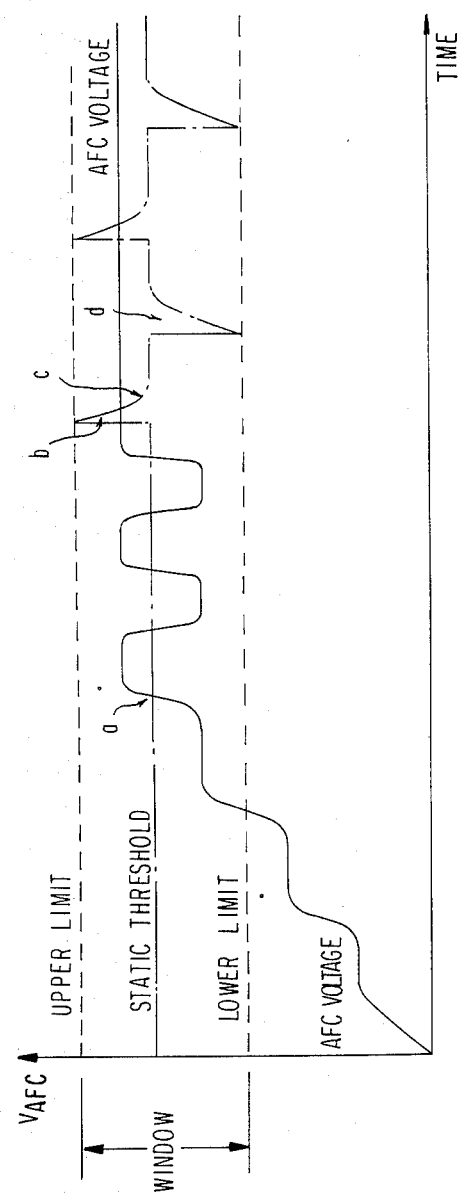
FIGS. 2A and 2B are waveform diagrams of the AFC voltage from the AFC detector and the corresponding output of the AFC comparator, respectively, shown in FIG. 1 and illustrating an operating mode wherein a carrier frequency is "trapped" within a frequency band.
Figure 2B:
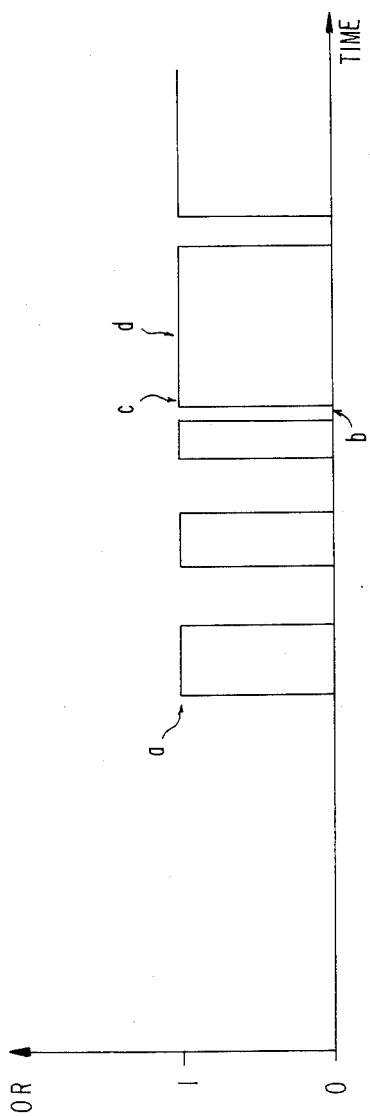

Now the possibility arises that the carrier frequency once found, will stray. This is important with video games, cable system converters, satellite TV converters and some apartment master antenna systems. In the vicinity of the correct frequency, the AFC output may be regarded as being approximately linear about a reference level representing zero frequency error (45.75 MHz in the example given). The AFC voltage output is shown in FIG. 2A and can be seen to be changing in response to the microprocessor controlled frequency steps of the VCO. Eventually, the voltage crosses the comparator threshold and the microporcessor switches routines in response to the first logic "1" following the change to 31.25 KHz steps. FIG. 2A shows the waveform of the AFC voltage, and superimposed on this waveform are positive and negative going voltage spikes caused by differentiating the pulses from the microprocessor. The upper and lower limits of these voltage spikes define a window centered on the static threshold. FIG. 2B shows the output of the AFC comparator 15. The traking routine moves the offset control on the comparator so that the threshold changes as shown. As long as the AFC voltage is below the static threshold, the output of the comparator 15 is a logic "0". At point a in FIG. 2A, the AFC voltage crosses the static threshold, and the output of the comparator 15 switches to a logic "1" as shown in FIG. 2B. When the microprocessor switches its routine to the track mode, it supplies pulses to the differentiator. This causes the threshold to temporarily increase on the leading edge of each pulse and decrease on the trailing edge of each pulse. Thus, at point b in FIG. 2A, the AFC voltage is again below the threshold voltage and at point c once again above the threshold voltage even though there has been no actual change in the AFC voltage. The result, however, is that the output of the comparator switches to logic "0" and back to logic "1". In this way the microprocessor confirms that the AFC voltage is within the window.

Figures 3A, 3B:
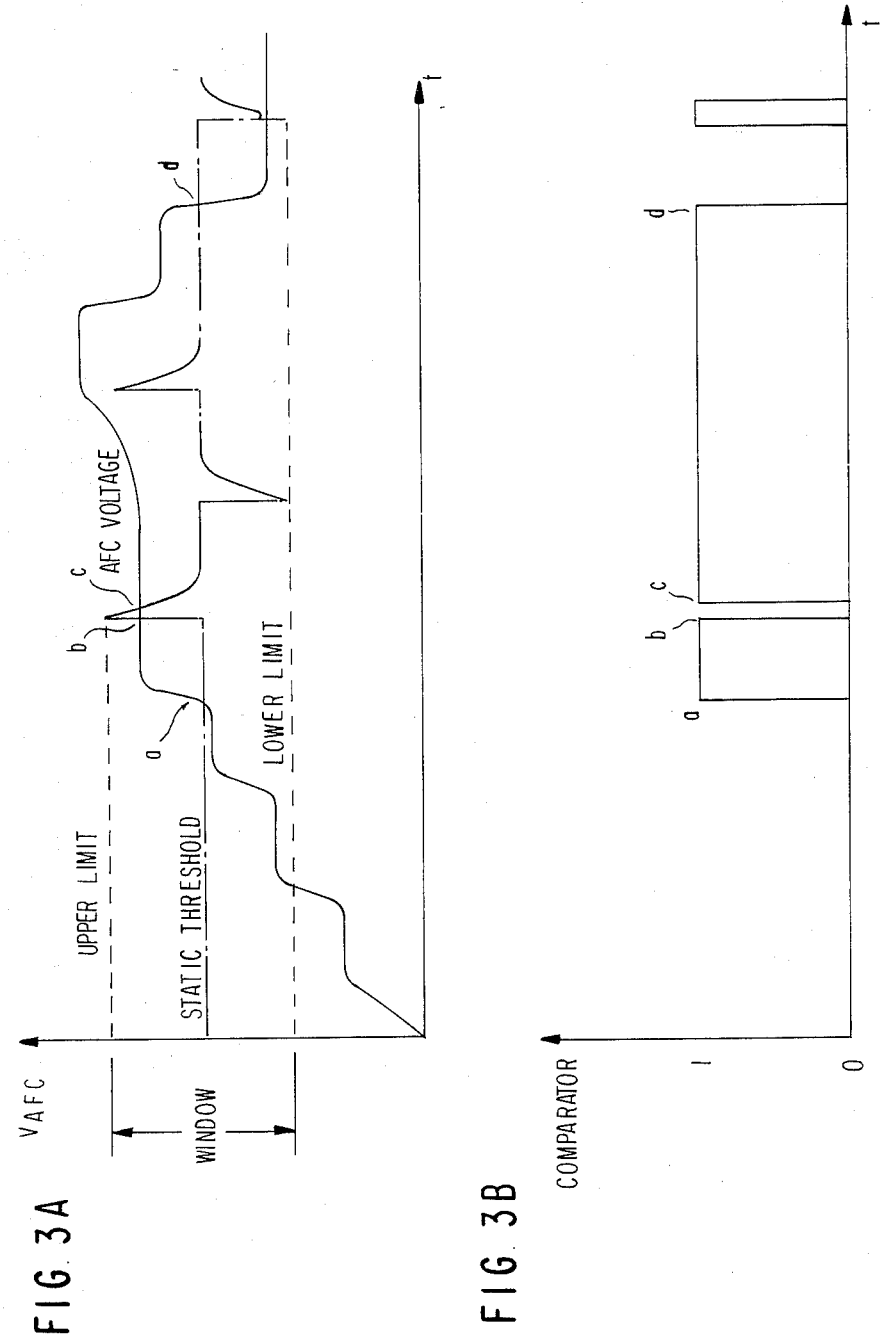
FIGS. 3A and 3B are waveform diagrams of the AFC voltage from the AFC detector and the corresponding output of the AFC comparator, respectively, showing a tracking mode of operation with a drifting carrier frequency.

Now consider the case where the AFC voltage drifts as shown in FIG. 3A. This condition is detected by the microprocessor when one or more successive pulses from the microprocessor to the comparator fail to cause a proper or expected output from the comparator. Upon detecting this condition, the microprocessor reverts to the frequency search mode, but this time the steps are in the opposite direction. At point d in FIG. 3A, the AFC voltage crosses the static threshold causing the output of comparator 15 to switch to a logic "0" as shown in FIG. 3B. The microprocessor then operates in the AFC tracking mode supplying pulses which are differentiated and applied to the input of the comparator.

It should be understood by those skilled in the art that substantially the same operation can be obtained by shorting or omitting capacitor 152 of the differentiator comprising resistor 151 and capacitor 152. However, faster operation is obtained with the preferred circuitry the avoidance of any routine to center the frequency in the window.

Figure 4:
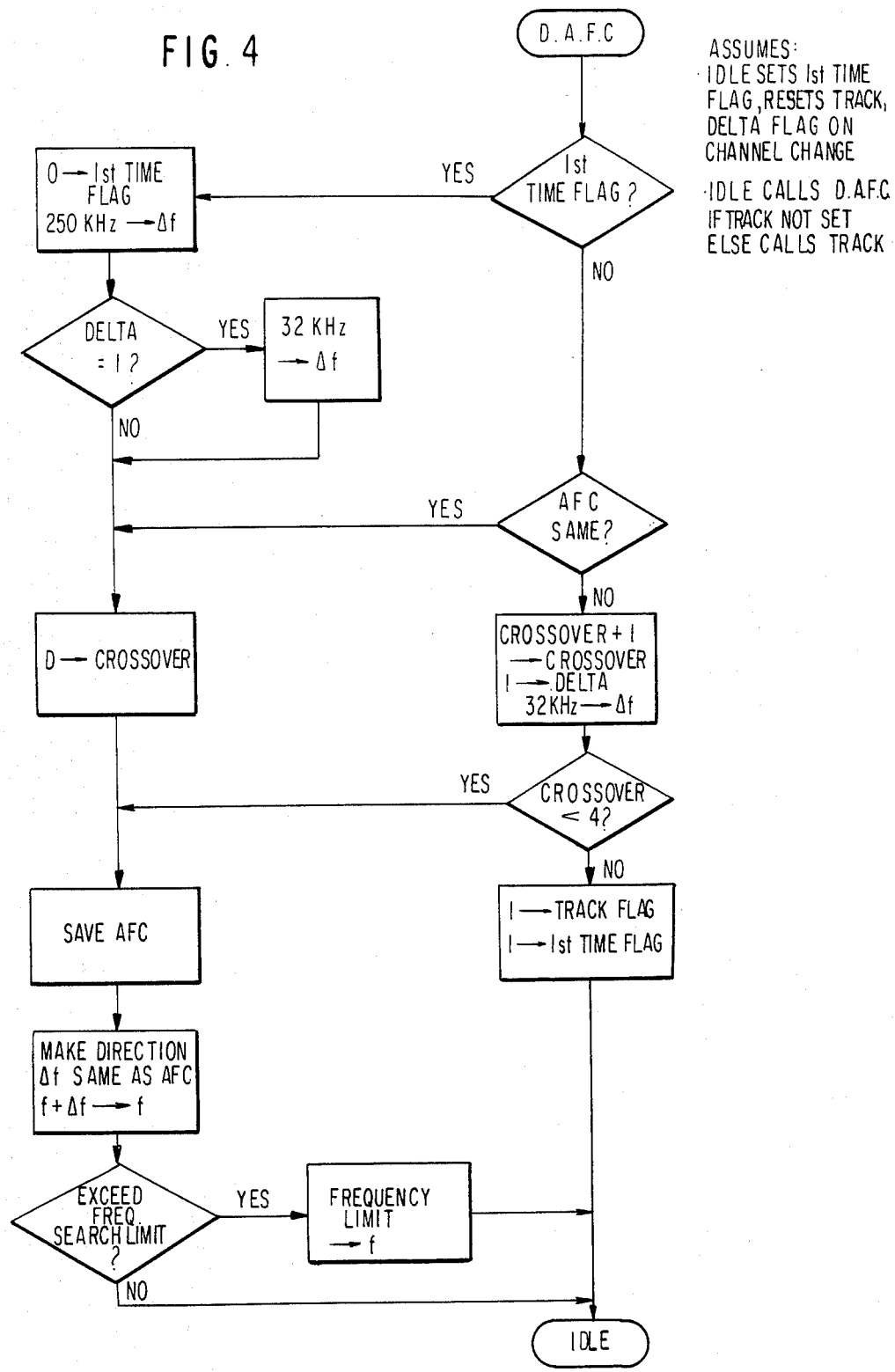
FIG. 4 is a flow diagram showing the digital automatic control (DAFC) according to the present invention.
Figure 5:
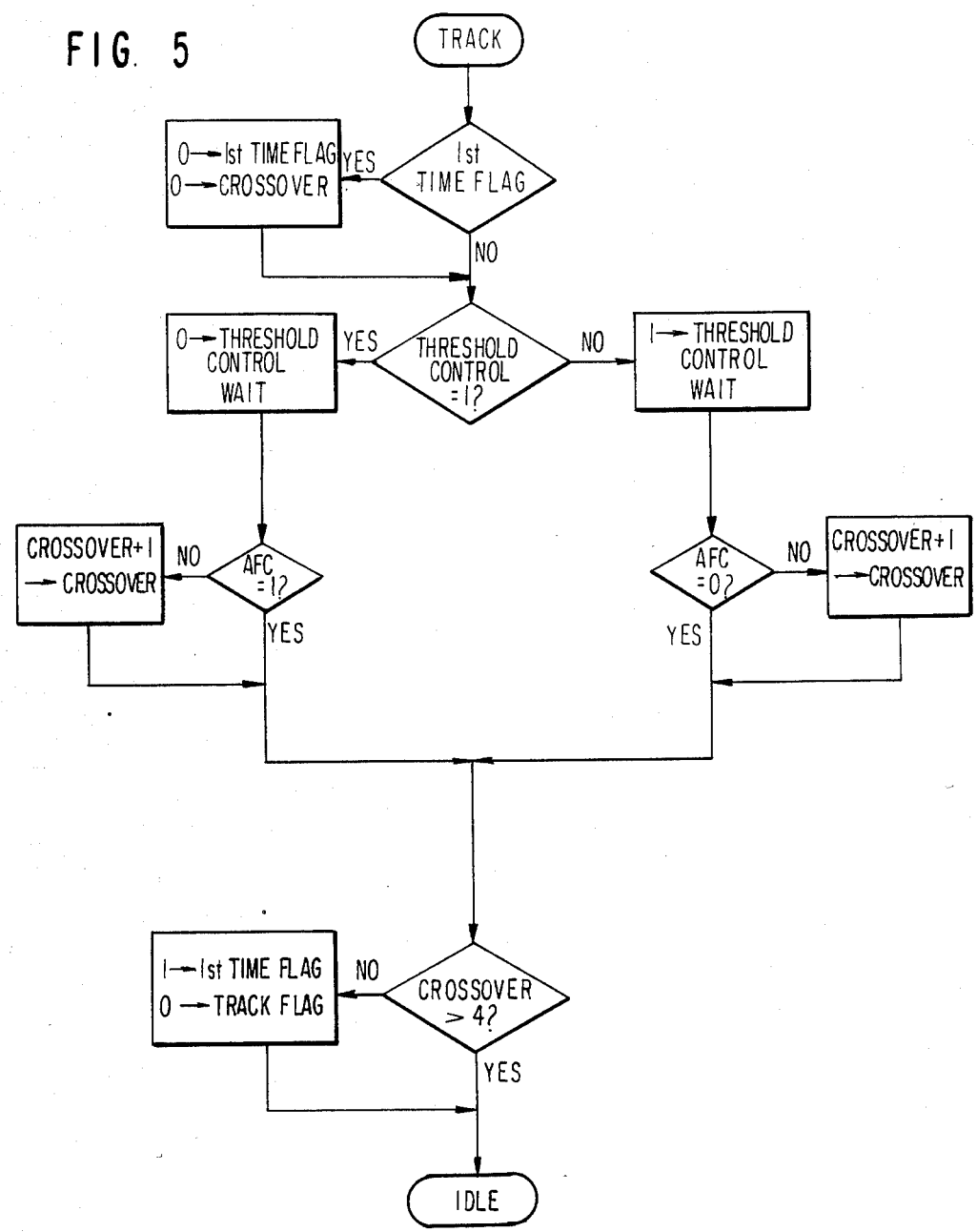
FIG. 5 is a flow diagram showing the AFC track mode of operation according to the invention.

The flow diagrams shown in FIGS. 4 and 5 show how the microprocessor controls the PLL and comparator threshold in response to the comparator output. The IDLE routine is the monitor or control routine which monitors keyboard commands from the user. Upon command for a channel change, IDLE loads the nominal frequency in the PLL and waits for the VCO to settle down. This channel change routine sets the first time flag and resets track and delta flags indicating IDLE should pass control to the DAFC routine and not the TRACK routine whose flag is zero. The delta flag controls the step size when the search routine first begins. When DAFC is first entered, the path is to the left where the first time flag is reset and a 250 kHz search step size is set. The delta flag is not set so the AFC crossover count is set to zero and the AFC input is memorized. To begin with, assume that the AFC input is zero. This would indicate the VCO should decrease in frequency so f is made −250 kHz and added to f as in the example from step one to step two. A check is next made to ensure that the channel frequency limits have not been exceeded. If the limits are exceeded, the frequency is reset within the limits. The microprocessor then returns to IDLE to wait a period of time for the VCO to settle down. The DAFC flag remains set, and so after a time, DAFC is again entered. However, the first time flag is cleared so the path is straight down where a check is made for a change in the AFC which would indicate that the correct frequency is within 250 kHz as in steps 6 to 7 of the example. When a crossover is found, the f size is changed to 32 kHz and a count of crossovers is begun to ensure that the routine finds a true signal and not noise. Those skilled in the art will recognize that the system would work, albeit not optimally, with one crossover count. The delta flag is set to prevent a return to 250 kHz steps. If four crossovers have not yet occured, the routine stores the last AFC and steps back in the direction that the AFC now points. When the AFC changes once more, the PLL will be within 32 kHz and will cross over three more times in this scheme. When the count is four, the flow continues down to set the track and first time flags.

The TRACK routine is entered only after DAFC is complete. Some of the logic is similar. If the first time flag is set, it and the crossover count are reset. The threshold control is switched to the alternate state and after a short wait for the comparator output to settle, the AFC is read. At point b in FIGS. 2A and 2B, the AFC comparator output will be zero and at point d it will be one if the AFC voltage is within limits. Now, if the frequency is stable, the threshold will change on each entry, the AFC will be tested and no crossover counts made. (Crossover count in the TRACK routine is the sum of detected errors.) If the frequency drifts, the changes in threshold will detect out of limit AFC voltage and the count will build up. Detected AFC errors are counted up to a limit to avoid noise. Again, those skilled in the art will recognize that the system will work, albeit not optimally, with one crossover count. If the limit is exceeded, the track flag is reset but the first time flag is set. DAFC finds the frequency once more and returns control to track as shown in FIGS. 3A and 3B. In the case where the frequency temporarily goes out of the channel limits, DAFC will remain at one limit until the frequency is again within limits and the operation is as just described.

I claim:

1. In a microprocessor controlled phase locked loop tuning system of the type wherein a microprocessor is responsive to a user input frequency selection to produce an output to a programmable frequency divider in the phase locked loop which determines a nominal frequency of a local oscillator in a tuning system, said tuning system including said local oscillator and a mixer, and an intermediate frequency section tuned to an intermediate frequency, said microprocessor being connected to said intermediate frequency section for sampling said intermediate frequency to determine whether the local oscillator needs to be adjusted to accommodate a frequency offset in the recieved signal, the microprocessor using this information to generate an output to the programmable frequency divider which determines the amount of frequency offset of the local oscillator frequency away from the nominal value, the improvement comprising:

the connection between said microprocessor and said intermediate frequency section being an automatic frequency control detector means for providing either a logic "0" or a logic "1" output to said microprocessor depending on whether the output from said intermediate frequency section is above or below a predetermined threshold, said microprocessor being responsive to the output of said detector means to control the direction of change in the tuning of the local oscillator frequency during a frequency search mode of operation; and pulse coupling means connected between said microprocessor and the input of said detector means for coupling pulses from said microprocessor to said detector means during a frequency track mode of operation, said microprocessor entering said frequency track mode after the output of said detector means switches logic states a predetermined number of times.

2. The improved microprocessor controlled phase locked loop tuning system according to claim 1 wherein said pulse coupling means is a differentiator means for producing voltage spikes that cause said threshold to temporarily alternately increase and decrease in value to define a window in which the output of said tuning system is tracked.

3. The improved microprocessor controlled phase locked loop tuning system according to claim 2 wherein said tuning system comprises an automatic frequency detector which provides the output to said automatic frequency control detector means.

4. The improved microprocessor controlled phase locked loop tuning system according to claim 1 further comprising:

phase detector means in said phase locked loop responsive to the output of said programmable frequency divider for comparing a sample of said local oscillator frequency with a reference frequency and producing output pulses that vary in width and polarity as a function of whether said local oscillator frequency is above or below said reference frequency; and filter means responsive to the output of said phase detector means for converting said output pulses into a varying d.c. voltage which is used to control said local oscillator frequency.

5. The improved microprocessor controlled phase locked loop tuning system according to claim 4 wherein said filter means comprises:

integrating means for passing only the low frequency components of said output pulses; and discharging means for providing a low leakage level for said integrating means thereby preventing said phase locked loop from locking at precisely zero error frequency.

* * * * *